US012663328B2

(12) United States Patent
Kang

(10) Patent No.: US 12,663,328 B2
(45) Date of Patent: Jun. 23, 2026

(54) DIFFERENTIAL PRESSURE MEASURING DEVICE AND SUBSTRATE TREATING FACILITY INCLUDING THE SAME

(71) Applicant: SEMES CO., LTD., Cheonan-si (KR)

(72) Inventor: Dong Hoon Kang, Bucheon-si (KR)

(73) Assignee: Semes Co., Ltd., Chungcheongnam-do (KR)

( * ) Notice: Subject to any disclaimer, the term of this patent is extended or adjusted under 35 U.S.C. 154(b) by 702 days.

(21) Appl. No.: 18/057,282

(22) Filed: Nov. 21, 2022

(65) Prior Publication Data

US 2023/0160768 A1      May 25, 2023

(30) Foreign Application Priority Data

Nov. 23, 2021      (KR) ........................ 10-2021-0162686

(51) Int. Cl.
G01L 13/00      (2006.01)
G01L 19/14      (2006.01)
H10P 72/00      (2026.01)
H10P 74/20      (2026.01)

(52) U.S. Cl.
CPC .......... G01L 13/00 (2013.01); H10P 72/0604 (2026.01); H10P 74/20 (2026.01); *G01L 19/147* (2013.01)

(58) Field of Classification Search
CPC ..... G01L 13/00; G01L 15/00; G01L 19/0007; G01L 19/147; H01L 21/67242; H01L 21/67253; H01L 21/67; H01L 21/67017; H01L 21/67173; H01L 21/67201;
(Continued)

(56) References Cited

U.S. PATENT DOCUMENTS 6,590,639 B1 * 7/2003 Yuan ................... G03F 7/70825
355/75
2001/0029889 A1 * 10/2001 Holcomb .......... H01L 21/67748
156/345.31
(Continued)

FOREIGN PATENT DOCUMENTS

CN      107104067 A  *  8/2017    ....... C23C 16/45544
JP      2005117007 A      4/2005
(Continued)

OTHER PUBLICATIONS

Translation_KR20180053922 (Year: 2016).*
(Continued)

*Primary Examiner* — Peter J Macchiarolo
*Assistant Examiner* — Monica S Young
(74) *Attorney, Agent, or Firm* — Harness, Dickey & Pierce, P.L.C.

(57) ABSTRACT

Provided is a substrate treating facility, including: an index module on which a substrate is loaded or unloaded; a treating module for performing a substrate treatment on the substrate loaded into the index module; a buffer chamber disposed between the index module and the treating module; and a differential pressure measuring device for measuring a differential pressure between a pressure at a specific position inside the substrate treating facility and a pressure at a reference position serving as a reference, in which the differential pressure measuring device is provided outside the substrate treating facility.

18 Claims, 11 Drawing Sheets

(58) Field of Classification Search
CPC ......... H01L 21/67225; H01L 21/67259; H01L 21/677; H01L 22/10
USPC ........................................................ 73/716
See application file for complete search history.

(56) References Cited

U.S. PATENT DOCUMENTS

| | | | | |
|---|---|---|---|---|
| 2005/0065634 A1* | 3/2005 | Nakajima | ........... | H01L 21/6875 |
| | | | | 700/213 |
| 2005/0114070 A1* | 5/2005 | Dozoretz | ................ | G01L 13/00 |
| | | | | 702/140 |
| 2011/0209560 A1* | 9/2011 | Ito | ..................... | H01L 21/67051 |
| | | | | 73/861.42 |
| 2017/0236735 A1* | 8/2017 | Leeser | .................... | C23C 16/52 |
| | | | | 137/12 |
| 2021/0020430 A1* | 1/2021 | Kim | .................. | H01L 21/67051 |

FOREIGN PATENT DOCUMENTS

| | | | | | |
|---|---|---|---|---|---|
| JP | 2006-125812 | A | | 5/2006 | |
| JP | 2011233707 | A * | 11/2011 | |
| KR | 10-2010-0059457 | A | | 6/2010 | |
| KR | 10-1736875 | | | 5/2017 | |
| KR | 10-20180053922 | A | | 5/2018 | |
| KR | 20180053922 | A * | 5/2018 | ....... H01L 21/67242 |
| KR | 10-20200141314 | A | | 12/2020 | |

OTHER PUBLICATIONS

Korean Office Action, dated Aug. 11, 2023, issued in corresponding Korean Patent Application No. 10-2021-0162686.
Office Action issued Jul. 12, 2025 in Chinese Application No. 202211469191.7.

\* cited by examiner (b)   (a)

DIFFERENTIAL PRESSURE MEASURING DEVICE AND SUBSTRATE TREATING FACILITY INCLUDING THE SAME

CROSS-REFERENCE TO RELATED APPLICATIONS

This application claims priority to and the benefit of Korean Patent Application No. 10-2021-0162686 filed in the Korean Intellectual Property Office on Nov. 23, 2021, the entire contents of which are incorporated herein by reference.

TECHNICAL FIELD

The present invention relates to a differential pressure measuring device and a substrate treating facility including the same.

BACKGROUND ART

Recently, as patterns on substrates are miniaturized and highly integrated, the importance of pressure and airflow management inside semiconductor manufacturing facilities is increasing. In particular, in order to prevent the inflow of external particles and effectively discharge the particles generated inside the semiconductor manufacturing facility, it is necessary to manage and adjust the airflow around the semiconductor manufacturing facility. In the case of airflow inside the semiconductor manufacturing facility, the pressure inside the semiconductor manufacturing facility is managed to be higher than the pressure outside the manufacturing facility. In addition, it is possible to adjust the airflow inside the semiconductor manufacturing facility by making the difference in pressure between the inside and the outside of the semiconductor manufacturing facility maintain a constant differential pressure.

In monitoring the differential pressure in the facility and controlling the differential pressure, it is important to control the reference pressure, which is the reference for measuring the differential pressure, to be constant. In general, the reference pressure is provided as the measured pressure at a specific location outside the facility. However, a reference pressure measuring port is affected by the downdraft that is continuously supplied from the upper portion of the semiconductor manufacturing line, the transferring means for transferring a transferred object, and the like, in the outside of the facility, and accordingly, there is a problem that a reference pressure hunting phenomenon occurs.

In addition, as the reference pressure is hunted, it is impossible to measure the exact differential pressure in the facility, so there is a problem in that it is difficult to manage the differential pressure.

SUMMARY OF THE INVENTION

The present invention has been made in an effort to provide a differential pressure measuring device capable of accurately measuring a differential pressure and a substrate treating facility including the same.

The present invention has also been made in an effort to provide a differential pressure measuring device capable of preventing hunting of a reference pressure, which is a reference for differential pressure measurement, and a substrate treating facility including the same.

The present invention has also been made in an effort to provide a differential pressure measuring device capable of minimizing environmental and artificial influences applied to a reference pressure measuring port, and a substrate treating facility including the same.

The object of the present invention is not limited thereto, and other objects not mentioned will be clearly understood by those of ordinary skill in the art from the following description.

An exemplary embodiment of the present invention provides a substrate treating facility, including: an index module on which a substrate is loaded or unloaded; a treating module for performing a substrate treatment on the substrate loaded into the index module; a buffer chamber disposed between the index module and the treating module; and a differential pressure measuring device for measuring a differential pressure between a pressure at a specific position inside the substrate treating facility and a pressure at a reference position serving as a reference, I which the differential pressure measuring device is provided outside the substrate treating facility.

The differential pressure measuring device may include: a first box unit; a second box unit provided above the first box unit; and a third box unit provided inside the second box unit, and the first box unit may include a differential pressure port provided on one side plate among a plurality of side plates and connected to the specific position by a first connection line, and a reference differential pressure port provided on the other side plate among the plurality of side plates and connected to the reference position by a second connection line.

Each of the first box unit and the second box unit may have an inner space, and may be provided so the inner space is sealed.

The first box unit may include a differential pressure board and a reference differential pressure board provided inside the first box unit, the differential pressure board may be connected to the first connection line to measure a pressure at the specific location, and the reference differential pressure board may be connected to the second connection line to measure the pressure at the reference position.

The reference position may be the inside of the third box unit.

The third box unit may include a first side plate and a second side plate which are disposed opposite to each other among a plurality of side plates, a first port provided on the first side plate, and a second port provided on the second side plate, the first side plate of the third box unit may be provided to be in contact with one of the plurality of side plates of the second box unit, and the second side plate of the third box unit is provided to be spaced apart from the plurality of side plates of the second box unit, and an inner space of the third box unit may communicate with an inner space of the second box unit by the second port of the second side plate.

The first port of the third box unit may be formed through the first side plate and the one side plate of the second box unit, and the first port may be connected to the second connection line.

The substrate treating facility may further include a controller, in which the controller may control a difference between the pressure at the specific position measured by the differential pressure board and the pressure at the reference position measured by the reference differential pressure board to be maintained constantly.

The pressure at the reference position may be provided as a pressure of the inner space of the third box unit, and a difference between the pressure of the inner space of the second box unit and the pressure of the inner space of the third box unit may be zero.

The differential pressure measuring device may be provided above the buffer chamber.

The differential pressure measuring device may be provided in a central region of an upper surface of the buffer chamber.

The differential pressure measuring device may be provided on a ceiling surface of a space in which the substrate treating facility is provided, and may be provided at a position that does not overlap with a transfer rail that transfers a transferred target.

The differential pressure measuring device may be provided at a position where the reference position is not affected by a surrounding environment.

Another exemplary embodiment of the present invention provides a differential pressure measuring device for measuring a differential pressure between a first pressure at a specific position and a second pressure at a reference position, the differential pressure measuring device comprising: a first box unit having a sealed inner space; a second box unit disposed above the first box unit and having a sealed inner space; and a third box unit provided inside the second box unit and having an inner space communicating with the inner space of the second box unit, in which the second pressure is a pressure of the inner space of the third box unit.

The first box unit may include a differential pressure board provided in the inner space of the first box unit and measuring the first pressure and a reference differential pressure board provided in the inner space of the first box unit and measuring the second pressure.

A side plate of the first box unit may include a differential pressure port to which a first connection line connecting the specific position and the differential pressure board is connected, and a reference differential pressure port to which a second connection line connecting the reference position and the reference differential pressure board is connected.

The third box unit may include a first side plate and a second side plate which are disposed opposite to each other among a plurality of side plates, a first port provided on the first side plate, and a second port provided on the second side plate, the first side plate of the third box unit may be provided to be in contact with one of the plurality of side plates of the second box unit, and the second side plate of the third box unit is provided to be spaced apart from the plurality of side plates of the second box unit, and the inner space of the third box unit may communicate with the inner space of the second box unit by the second port of the second side plate, and the second connection line may be connected to the first port of the third box unit.

A difference between the pressure of the inner space of the second box unit and the pressure of the inner space of the third box unit may be zero.

Still another exemplary embodiment of the present invention provides a substrate treating facility, including: an index module for loading or unloading a substrate; a treating module for performing a substrate treatment on the substrate loaded into the index module, and including a plurality of process chambers that perform different treatments on the substrate; a buffer chamber disposed between the index module and the treating module; a differential pressure measuring device disposed above the buffer chamber and for measuring a differential pressure between a pressure inside the process chamber and a pressure at a reference position; and a controller, in which the differential pressure measuring device includes: a first box unit having a sealed inner space;

a second box unit disposed above the first box unit and having a sealed inner space; and a third box unit provided inside the second box unit and having an inner space communicating with the inner space of the second box unit, and the pressure at the reference position is the pressure of the inner space of the third box unit.

The plurality of process chambers may include a first process chamber in which a liquid treatment is performed on the substrate, and a second process chamber in which a heat treatment is performed on the substrate, and the first box unit may include a first differential pressure board which is provided in the inner space of the first box unit and measures a pressure inside the first process chamber, a second differential pressure board which is provided in the inner space of the first box unit and measures a pressure inside the second process chamber, and a reference differential pressure board which is provided in the inner space of the first box unit and measures a reference pressure, the controller may control a difference between a pressure measured by the first differential pressure board and a reference pressure measured by the reference differential pressure board to be maintained as a first differential pressure, and controls a difference between a pressure measured by the second differential pressure board and a pressure measured by the reference differential pressure board is maintained as a second differential pressure, and the first differential pressure and the second differential pressure may be different.

According to the exemplary embodiment of the present invention, it is possible to provide the differential pressure measuring device capable of accurately measuring a differential pressure and the substrate treating facility including the same.

In addition, it is possible to prevent hunting of a reference pressure, which is a reference for measuring a differential pressure.

In addition, it is possible to minimize the environmental and artificial influences applied to a reference pressure measuring port.

The effect of the present invention is not limited to the foregoing effects, and the not-mentioned effects will be clearly understood by those skilled in the art from the present specification and the accompanying drawings.

DETAILED DESCRIPTION

Figure 1:
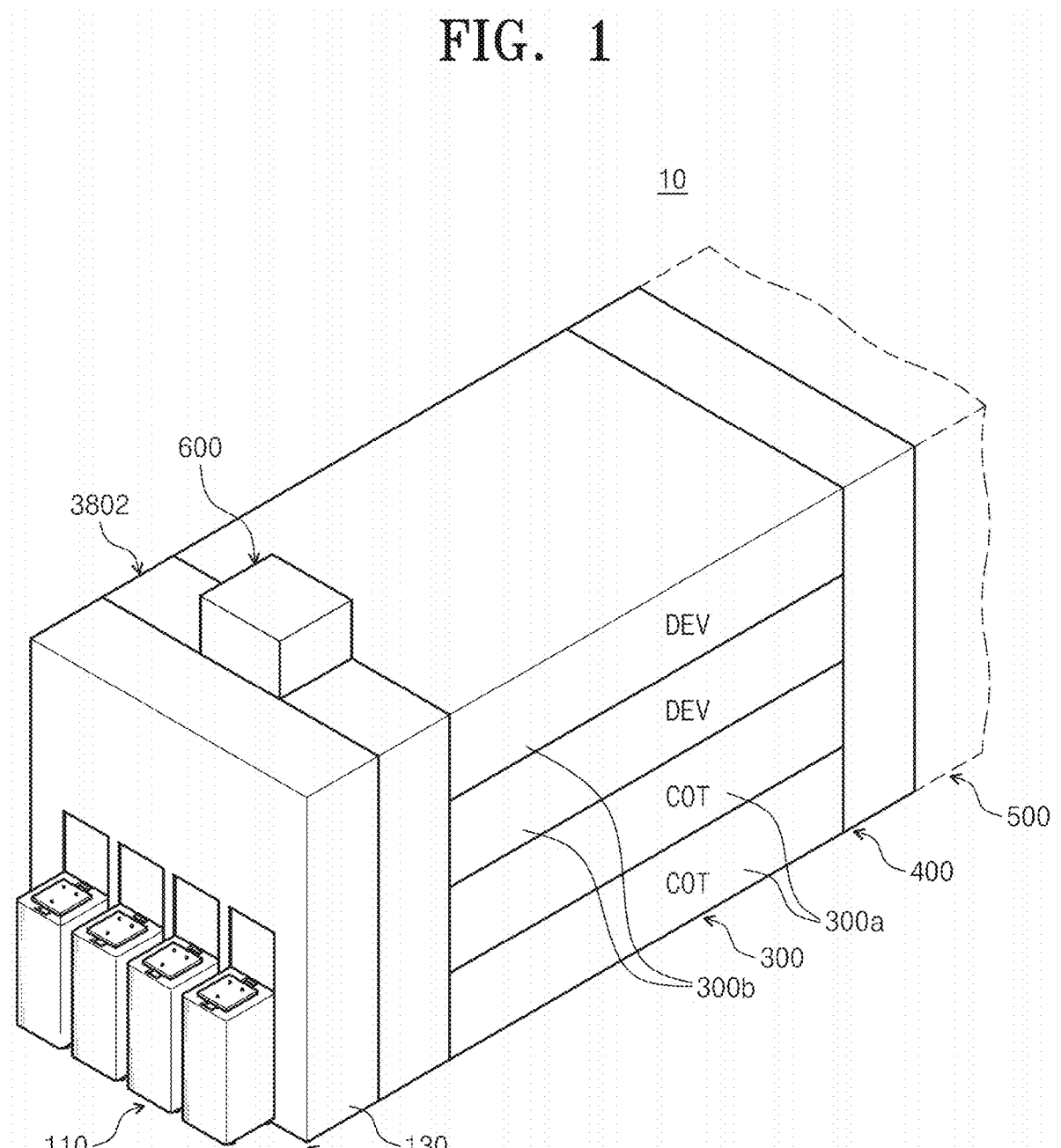
FIG. 1 is a perspective view schematically illustrating a substrate treating facility according to an exemplary embodiment of the present invention.

Hereinafter, an exemplary embodiment of the present invention will be described more fully hereinafter with reference to the accompanying drawings, in which exemplary embodiments of the invention are illustrated. However, the present invention can be variously implemented and is not limited to the following exemplary embodiments. In the following description of the present invention, a detailed description of known functions and configurations incorporated herein is omitted to avoid making the subject matter of the present invention unclear. In addition, the same reference numerals are used throughout the drawings for parts having similar functions and actions.

Unless explicitly described to the contrary, the word "comprise" and variations such as "comprises" or "comprising" will be understood to imply the inclusion of stated elements but not the exclusion of any other elements. It will be appreciated that terms "including" and "having" are intended to designate the existence of characteristics, numbers, operations, operations, constituent elements, and components described in the specification or a combination thereof, and do not exclude a possibility of the existence or addition of one or more other characteristics, numbers, operations, operations, constituent elements, and components, or a combination thereof in advance.

Singular expressions used herein include plurals expressions unless they have definitely opposite meanings in the context. Accordingly, shapes, sizes, and the like of the elements in the drawing may be exaggerated for clearer description.

Terms, such as first and second, are used for describing various constituent elements, but the constituent elements are not limited by the terms. The terms are used only to discriminate one constituent element from another constituent element. For example, without departing from the scope of the invention, a first constituent element may be named as a second constituent element, and similarly a second constituent element may be named as a first constituent element.

It should be understood that when one constituent element referred to as being "coupled to" or "connected to" another constituent element, one constituent element can be directly coupled to or connected to the other constituent element, but intervening elements may also be present. In contrast, when one constituent element is "directly coupled to" or "directly connected to" another constituent element, it should be understood that there are no intervening element present. Other expressions describing the relationship between the constituent elements, such as "between ~" and "just between ~" or "adjacent to ~" and "directly adjacent to ~" should be interpreted similarly.

All terms used herein including technical or scientific terms have the same meanings as meanings which are generally understood by those skilled in the art unless they are differently defined. Terms defined in generally used dictionary shall be construed that they have meanings matching those in the context of a related art, and shall not be construed in ideal or excessively formal meanings unless they are clearly defined in the present application.

A device of the present exemplary embodiment may be used to perform photo processing on a circular substrate. In particular, the device of the present exemplary embodiment may be connected to an exposure device and used to perform a coating process and a developing process on a substrate. However, the technical spirit of the present invention is not limited thereto, and may be used in various types of processes for supplying a treatment liquid to the substrate while rotating the substrate. Hereinafter, a case in which a wafer is used as a substrate will be described as an example.

Hereinafter, an exemplary embodiment of the present invention will be described with reference to FIGS. 1 to 13.

Figure 2:
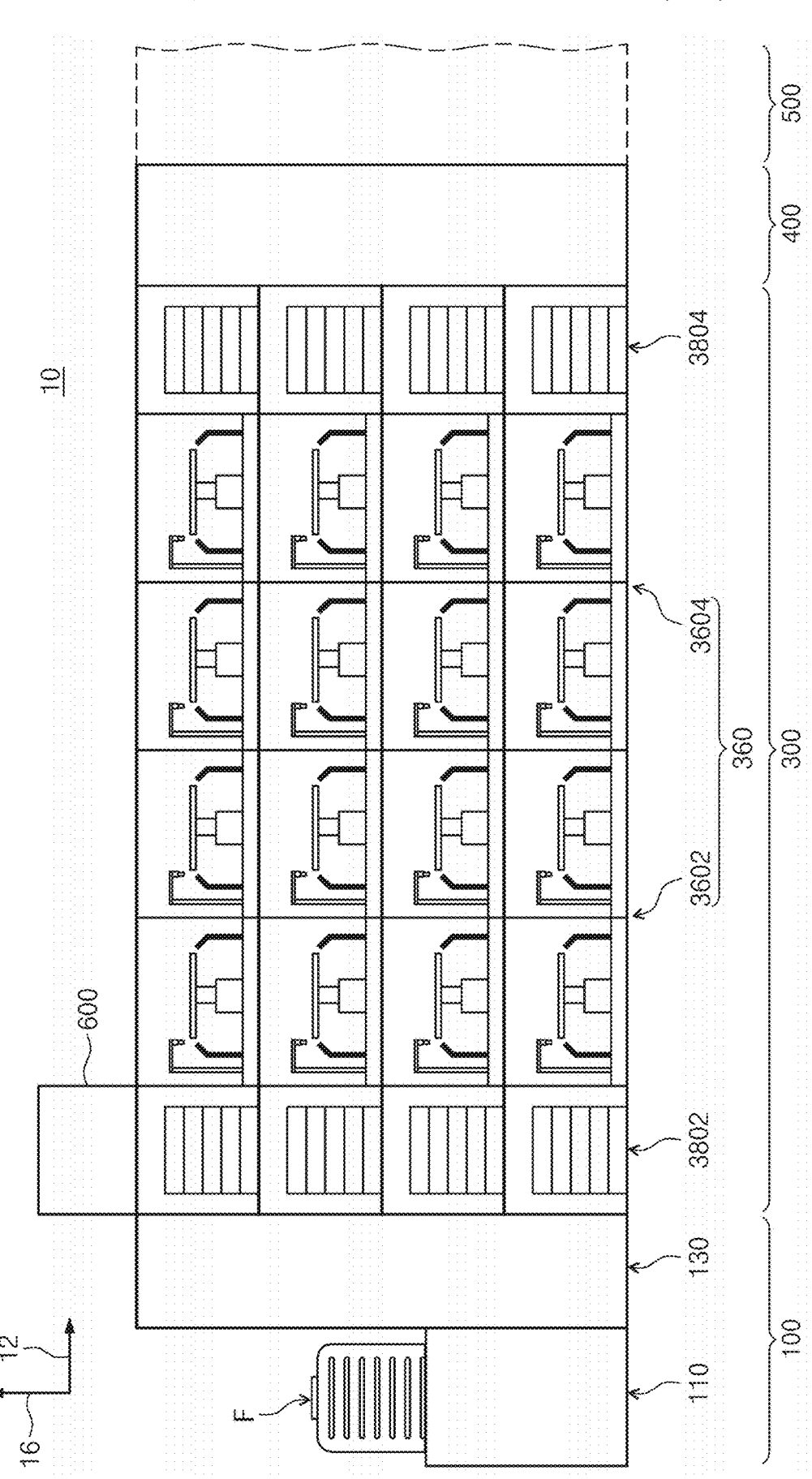
FIG. 2 is a cross-sectional view of a substrate treating facility illustrating a coating block or a developing block of FIG. 1.
Figure 3:
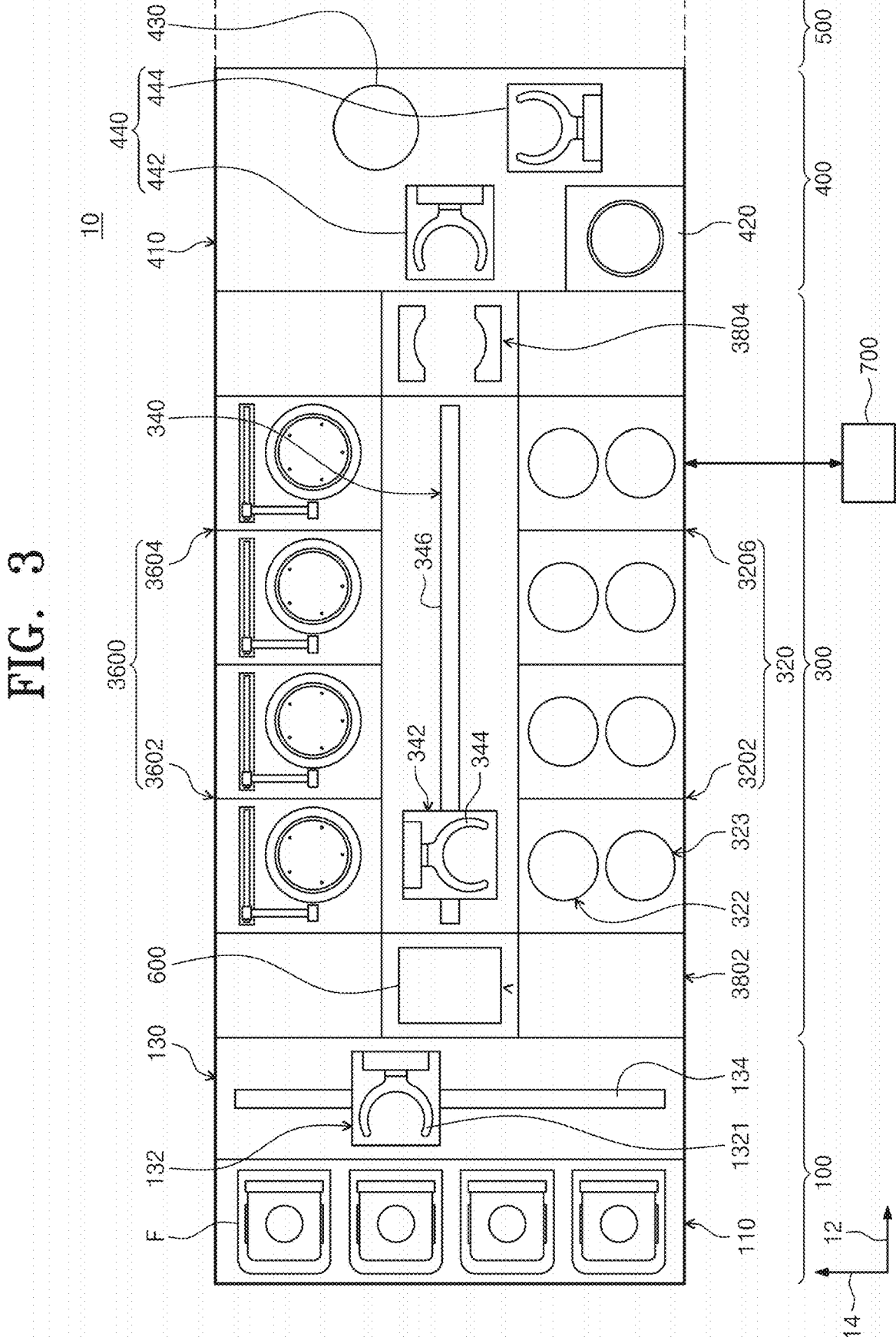
FIG. 3 is a top plan view of the substrate treating facility of FIG. 1.

FIG. 1 is a perspective view schematically illustrating a substrate treating facility according to an exemplary embodiment of the present invention, FIG. 2 is a cross-sectional view of a substrate treating facility illustrating a coating block or a developing block of FIG. 1, and FIG. 3 is a top plan view of the substrate treating facility of FIG. 1.

Referring to FIGS. 1 to 3, a substrate treating facility 10 according to the exemplary embodiment of the present invention includes an index module 100, a treating module 300, and an interface module 400. According to an example, the index module 100, the treating module 300, and the interface module 400 may be sequentially arranged in a line. Hereinafter, a direction in which the index module 100, the treating module 300, and the interface module 400 are arranged is referred to as a first direction 12, and a direction perpendicular to the first direction 12 when viewed from the top is referred to as a second direction 14, and a direction perpendicular to both the first direction 12 and the second direction 14 is referred to as a third direction 16.

The index module 100 may transfer a substrate W to the treating module 300 from a vessel F in which the substrate W is accommodated, and receive the completely treated substrate W into the vessel F. A longitudinal direction of the index module 100 may be provided in the second direction 14. The index module 100 may include a load port 110 and an index frame 130. The load port 110 may be coupled to the index frame 130. The load port 110 may be coupled to one side of the index frame 130. The load port 110 may be disposed on the opposite side of the treating module 300 with respect to the index frame 130. The vessel F in which the plurality of substrates W are accommodated may be placed in the load port 110. The load port 110 may include a plurality of load ports 110. The plurality of load ports 110 may be disposed along the second direction 14. The plurality of load ports 110 may be disposed along the longitudinal direction of the index frame 130.

The vessel (F) may be provided as a vessel for sealing. For example, the vessel F may be provided as a Front Open Unified Pod (FOUP). The vessel F may be placed on the load port 110 by a transfer means (not illustrated), such as an OverHead Transfer (OHT), an overhead conveyor, or an automatic guided vehicle, or an operator.

The index frame 130 may transfer the substrate W between the vessel F placed on the load port 110 and the treating module 300. The index frame 130 may include an index robot 132 and a guide rail 134. The guide rail 134 may be provided inside the index frame 130, and a longitudinal direction thereof may be provided in the second direction 14. The longitudinal direction of the guide rail 134 may be the same as the longitudinal direction of the index frame 130. The index robot 132 may be provided movably on the guide rail 134. For example, the index robot 132 may move in the second direction along the guide rail 134. The index robot

132 may include a hand 1321 on which the substrate W is placed. The hand 1321 may move forward and backward based on an axis in the longitudinal direction of the guide rail 134. In addition, the hand 1321 may be rotated about the third direction 16 as an axis. Also, the hand 1321 may be movable in the third direction 16.

The treating module 300 may perform a coating process and a developing process on the substrate W. The treating module 300 includes a coating block 300a and a developing block 300b. The coating block 300a may perform a coating process on the substrate W. The developing block 300b may perform a developing process on the substrate W. The coating block 300a may be provided as a plurality of coating blocks 300a. The plurality of coating blocks 300a may be provided to be stacked on each other. The developing block 300b may include a plurality of developing blocks 300b. The plurality of developing blocks 300b may be provided to be stacked on each other. Also, the coating block 300a and the developing block 300b may be stacked on each other. For example, the plurality of coating blocks 300a and the plurality of developing blocks 300a may be stacked. As another example, one coating block 300a and one developing block 300b may be alternately stacked. Referring to the exemplary embodiment of FIG. 2, the coating block 300a and the developing block 300b may include two coating blocks 300a and two developing blocks 300b, respectively. Also, the two coating blocks 300a may be disposed under the two developing blocks 300b.

The plurality of coating blocks 300a may perform the same process as each other, and may be provided in the same structure. Further, the plurality of developing blocks 300b may perform the same process and may be provided in the same structure.

Referring to FIG. 3, the coating block 300a may include a heat treating chamber 320, a transfer chamber 340, a liquid treating chamber 360, and a buffer chamber 380. The heat treating chamber 320 may perform a heat treatment process on the substrate W. The heat treating process may include a cooling process and a heating process. The liquid treating chamber 360 may form a liquid film by supplying a liquid onto the substrate W. The liquid film may be a photoresist film or an antireflection film. The transfer chamber 340 may transfer the substrate W between the heat treating chamber 320 and the liquid treating chamber 360 in the coating block 300a.

The transfer chamber 340 may be provided so that a longitudinal direction thereof is parallel to the first direction 12. The transfer chamber 340 may include a transfer robot 342 and a guide rail 346. A guide rail 346 may be provided in the transfer chamber 340. A longitudinal direction of the guide rail 346 may be provided to be parallel to the first direction 12. The guide rail 346 may have the same longitudinal direction as the longitudinal direction of the transfer chamber 340. The transfer robot 342 may transfer a substrate between the heat treating chamber 320, the liquid treating chamber 360, and the buffer chamber 380. The transfer robot 342 may be provided movably on the guide rail 346. The transfer robot 342 may have a hand 344 on which the substrate W is placed. The hand 344 may move the transfer chamber 340 forward and backward based on an axis in the longitudinal direction of the guide rail 346. In addition, the hand 344 may be provided to be rotatable about the third direction 16 as an axis. In addition, the hand 344 may be provided to be movable along the third direction 16.

Figure 4:
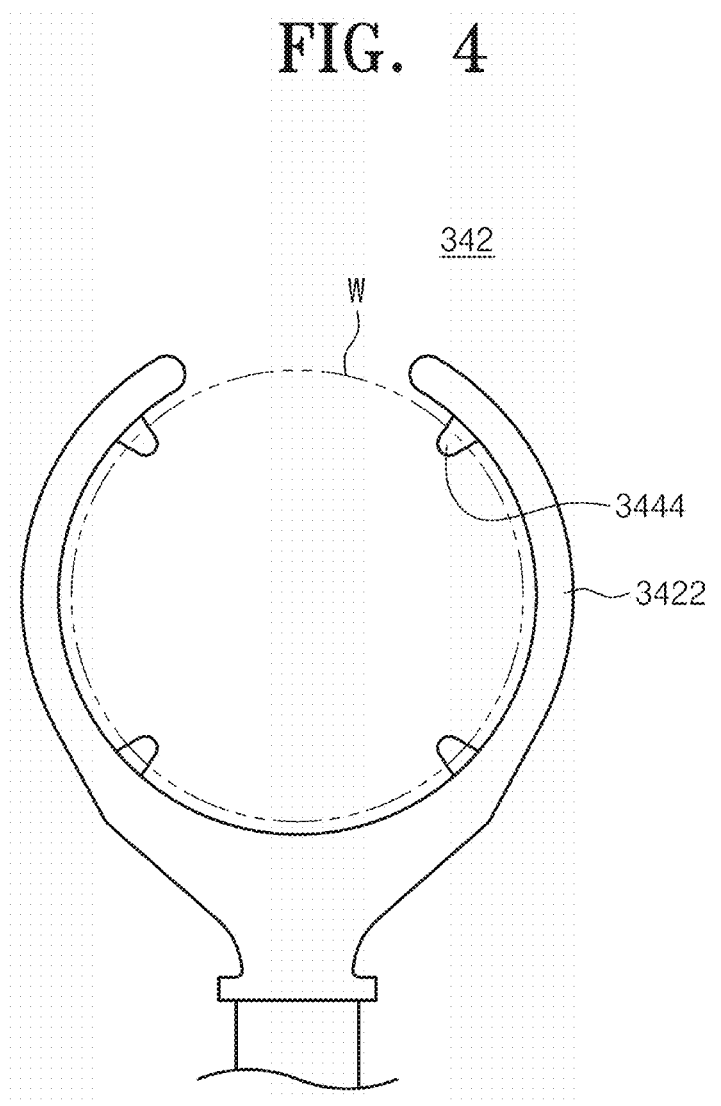
FIG. 4 is a diagram illustrating an example of a hand of a transfer robot provided in a transfer chamber of FIG. 3.

FIG. 4 is a diagram illustrating an example of the hand of the transfer robot provided in the transfer chamber of FIG. 3.

Referring to FIG. 4, the hand 344 of the transfer robot 342 may include a base 3442 and a support protrusion 3444. The base 3442 may be provided in an annular ring shape in which a portion of the circumference is cut off. The base 3442 may have an inner diameter greater than the diameter of the substrate W. The support protrusion 3444 may protrude inward from the base 3442. The support protrusion 3444 may include a plurality of support protrusions 3444. The plurality of support protrusions 3444 may be spaced apart from each other. The plurality of support protrusions 3444 may support an edge region of the substrate W. According to the example, four support protrusions 3444 may be provided at equal intervals.

A plurality of heat treating chambers 320 may be provided. The plurality of heat treating chambers 320 may be arranged along the first direction 12. The plurality of heat treating chambers 320 may be disposed at one side of the transfer chamber 340. Some of the plurality of heat treating chambers 320 may be provided at a position adjacent to the index module 100. Hereinafter, these heat treating chambers 320 may be referred to as front heat treating chambers 3202. Another portion of the plurality of heat treating chambers 320 may be provided at a position adjacent to the interface module 400. Hereinafter, these heat treating chambers 320 may be referred to as rear heat treating chambers 3204. A heat treatment process may be performed on the substrate W in the front heat treating chamber 3202 and the rear heat treating chamber 3204. The front heat treating chamber 3202 and the rear heat treating chamber 3204 may be provided in the same structure.

Figure 5:
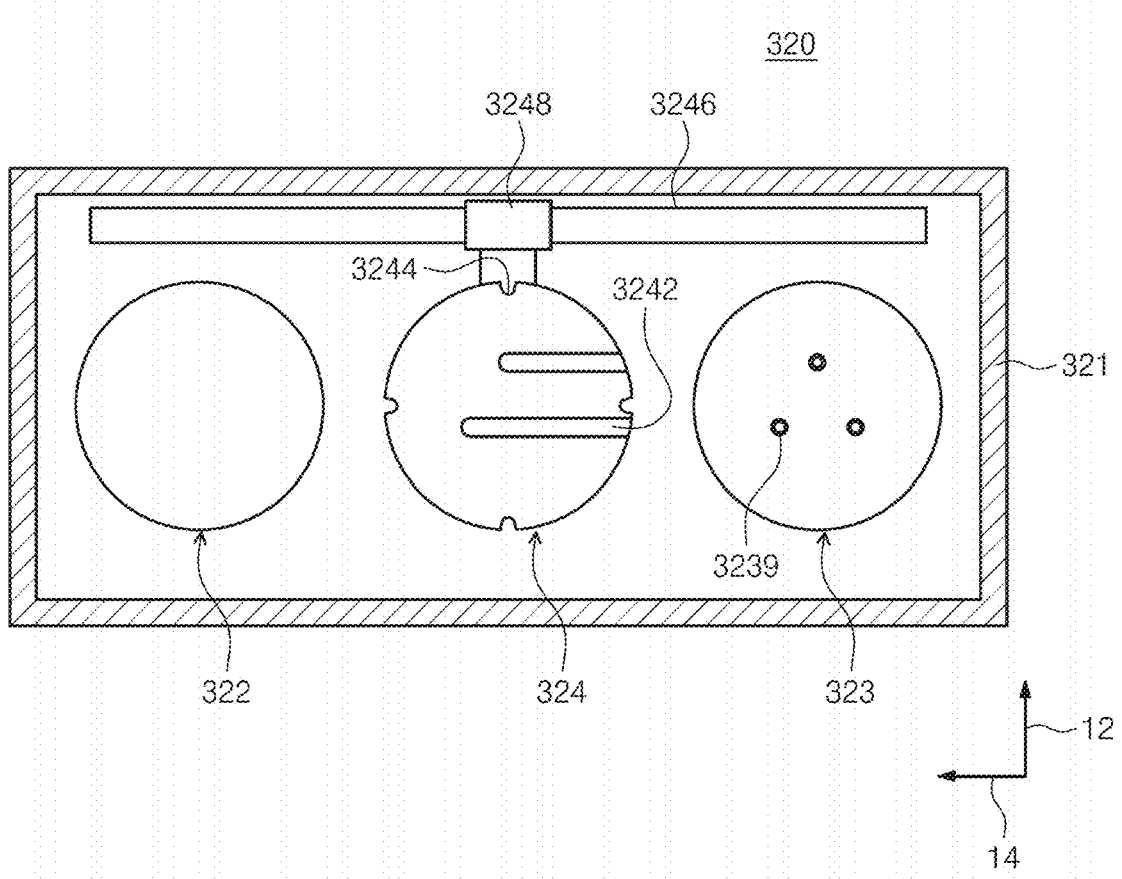
FIG. 5 is a top plan view schematically illustrating an example of a heat treating chamber of FIG. 3.
Figure 6:
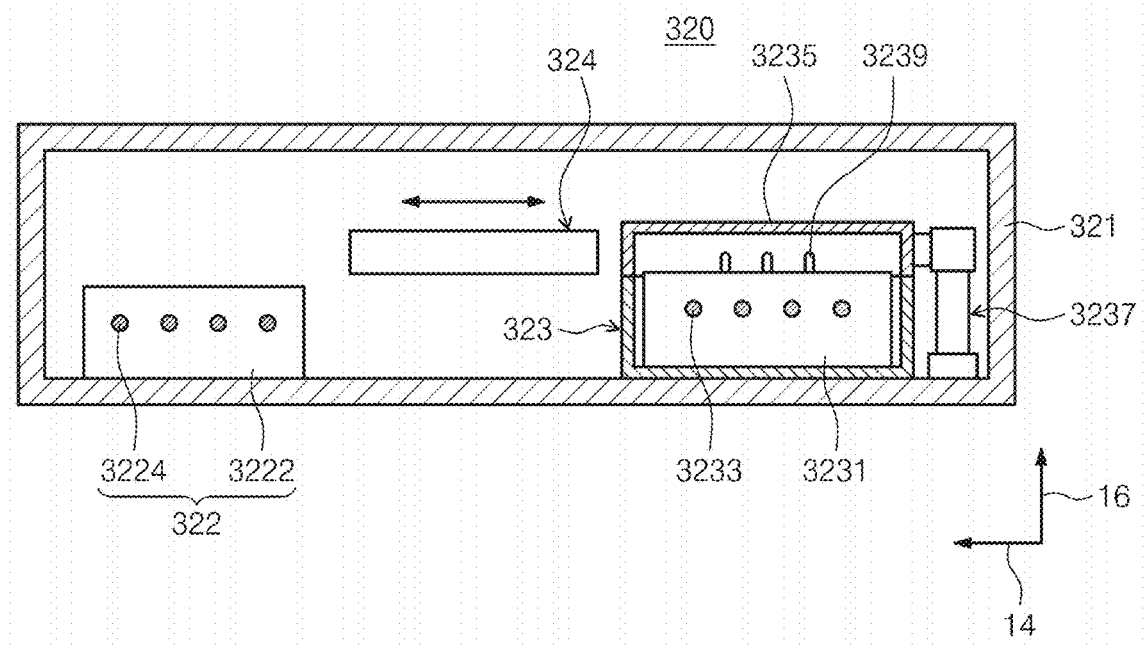
FIG. 6 is a front view of the heat treating chamber of FIG. 5.

FIG. 5 is a top plan view schematically illustrating an example of the heat treating chamber of FIG. 3, and FIG. 6 is a front view of the heat treating chamber of FIG. 5. Referring to FIGS. 5 and 6, the heat treating chamber 320 may include a housing 321, a cooling unit 322, a heating unit 323, and a transfer plate 324.

The housing 321 may be provided in the shape of a substantially rectangular parallelepiped. An entrance (not illustrated) through which the substrate W enters and exits may be formed on a sidewall of the housing 321. The entrance may remain open. Optionally, a door (not illustrated) for opening and closing the entrance may be provided. The cooling unit 322, the heating unit 323, and the transfer plate 324 may be provided in the housing 321. The cooling unit 322 and the heating unit 323 may be provided side by side along the second direction 14. According to the example, the cooling unit 3220 may be located closer to the transfer chamber 3400 than the heating unit 323.

The cooling unit 322 may include a cooling plate 3222. The cooling plate 3222 may have a generally circular shape when viewed from the top. A cooling member 3224 may be provided on the cooling plate 3222. According to the example, the cooling member 3224 is formed inside the cooling plate 3222 and may be provided as a flow path through which the cooling fluid flows.

The heating unit 323 may include a heating plate 3231, a heater 3233, and a cover 3235. The heating plate 3231 may have a generally circular shape when viewed from the top. The heating plate 3231 may have a larger diameter than the substrate W. The heater 3233 may be installed on the heating plate 3231. The heater 3233 may be provided as a heating resistor to which current is applied. Lift pins 3239 drivable in the vertical direction along the third direction 16 may be provided on the heating plate 3231. The lift pin 3239 may receive the substrate W from an external transfer means and put the substrate W down on the heating plate 3231 or lift the substrate W from the heating plate 3231 and transfer the substrate W it to the transfer means outside the heating unit 3231. According to the example, three lift pins 3239 may be provided. The cover 3235 may have a space with an open lower portion therein. The cover 3235 is positioned on the heating plate 3231 and may be moved in the vertical direction by the driver 3237. When the cover 3235 is in contact with the heating plate 3231, a space surrounded by the cover 3235 and the heating plate 3231 may be provided as a heating space for heating the substrate W.

The transfer plate 324 is provided in a substantially circular plate shape, and may have a diameter corresponding to that of the substrate W. A slit-shaped guide groove 3242 may be formed in the transfer plate 340. The guide groove 3242 may be formed to extend from the end of the transfer plate 340 to the inside of the transfer plate 340. A longitudinal direction of the guide groove 3242 may be formed in the second direction 14. The guide groove 3242 may include a plurality of guide grooves 3242. The plurality of guide grooves 3242 may be spaced apart from each other in the first direction 12. The guide groove 3242 may prevent the transfer plate 324 and the lift pins 3239 from interfering with each other when the substrate W is transferred between the transfer plate 340 and the heating unit 323.

A notch 3244 may be formed at an edge of the transfer plate 324. The notch 3244 may have a shape corresponding to a protrusion 3444 formed on the hand 342 of the transfer robot 344. Also, the notch 3244 may be provided in a number corresponding to the number of protrusions 3444 formed on the hand 344. Also, the notch 3244 may be formed at a position corresponding to that of the protrusion 3444 formed on the hand 344. The substrate W may be transferred between the hand 344 and the transfer plate 340 at the location where the hand 344 and the transfer plate 340 are aligned in the vertical direction. The notch 3244 may include a plurality of notches 3244. The plurality of notches 3244 may be disposed to be spaced apart from each other along the edge of the transfer plate 324. The plurality of notches 3244 may be formed at positions where the plurality of notches 3244 does not overlap the guide groove 3242. For example, one guide groove 3242 may be formed between two notches 3244. For example, one notch 3244 may be formed between two guide grooves 3242.

The heat treating chamber 320 may include a guide rail 3246 provided therein. A longitudinal direction of the guide rail 3246 may have the second direction 14. The transfer plate 340 may be mounted onto the guide rail 3246. The transfer plate 340 may be moved along the guide rail 3246 by the driver 3288. The transfer plate 340 may transfer the substrate W between the cooling unit 322 and the heating unit 323 while moving along the guide rail 3246. The transfer plate 340 may move an upper region of the cooling plate 3222 and an upper region of the heating plate 3231 along the guide rail 3246.

The heating of the substrate W may be performed in the state where the substrate W is directly placed on the heating plate 3231, and the cooling of the substrate W may be performed in the state where the transfer plate 324 on which the substrate W is placed is in contact with the cooling plate 3222. The transfer plate 324 may be made of a material having high transmittance so that the heat is transmitted well between the cooling plate 3222 and the substrate W. According to the example, the transfer plate 324 may be made of a metal material.

The heating units 323 provided in some of the heat treating chambers 320 may supply a gas while heating the substrate W to improve the adhesion rate of the photoresist to the substrate W. According to an example, the gas may be hexamethyldisilane (HMDS) gas.

The liquid treating chambers 360 may be provided in plural. Some of the liquid treating chambers 360 may be provided to be stacked with each other. The plurality of liquid treating chambers 360 may be disposed at one side of the transfer chamber 340. The plurality of liquid treating chambers 360 may be arranged side by side in the first direction 12. Some of the plurality of liquid treating chambers 360 may be provided at positions adjacent to the index module 100. Hereinafter, the liquid treating chambers are called the front liquid treating chambers 3602. Another some of the plurality of liquid treating chambers 360 may be provided at positions adjacent to the interface module 400. Hereinafter, the liquid treating chambers are called the rear liquid treating chambers 3604.

The front liquid treating chamber 3602 may coat a first liquid on the substrate W, and the rear liquid treating chamber 3602 may coat a second liquid on the substrate W. The first liquid and the second liquid may be different types of liquid. According to the exemplary embodiment, the first liquid may be provided as an antireflection film and the second liquid may be provided as a photoresist. The photoresist may be coated onto the substrate W coated with the antireflection film. Optionally, the first liquid may be a photoresist, and the second liquid may be an antireflection film. In this case, the antireflection film may be applied onto the substrate W coated with the photoresist. Optionally, the first liquid and the second liquid are the same type of liquid, and both the first liquid and the second liquid may be the photoresist.

Figure 7:
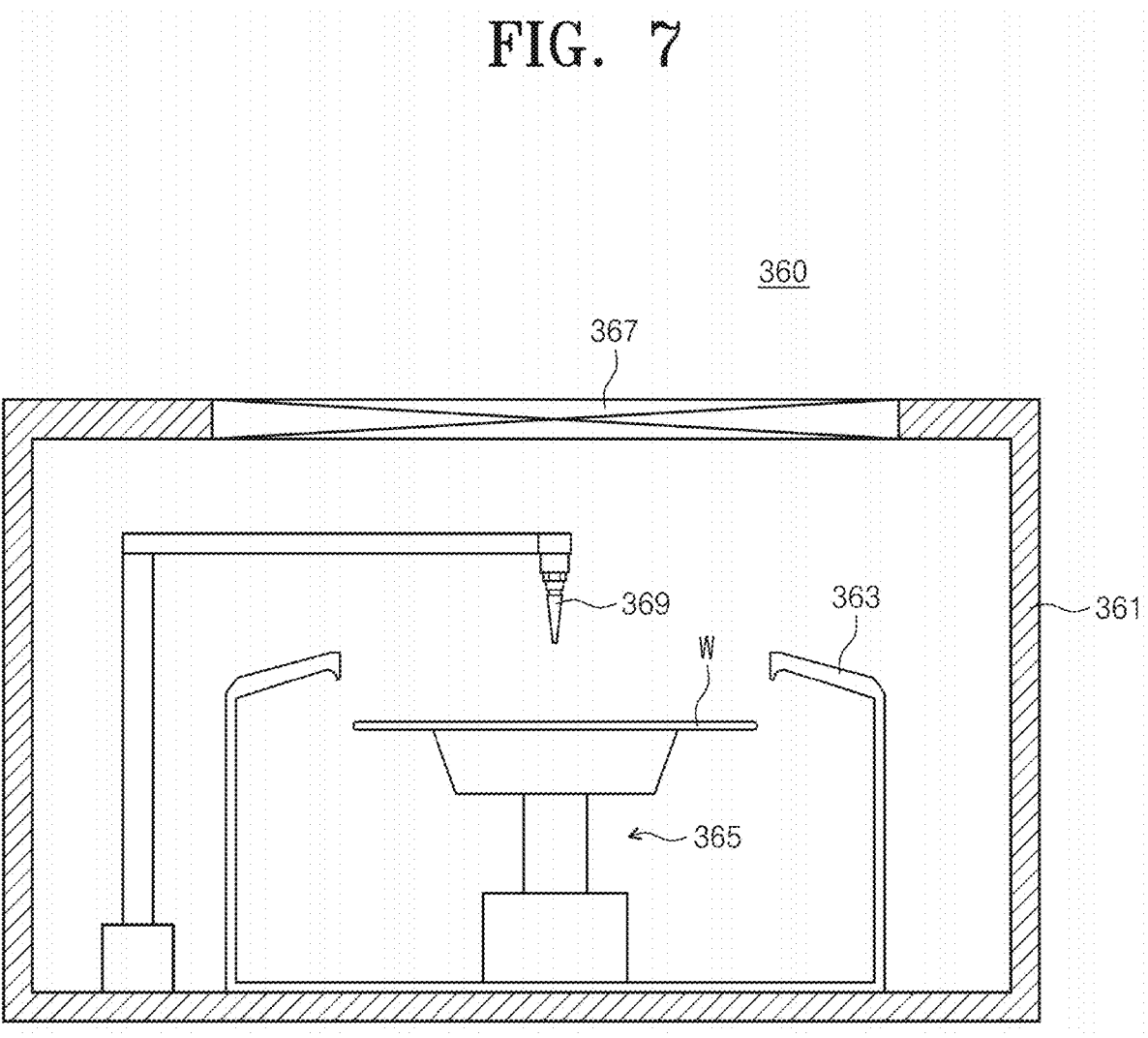
FIG. 7 is a diagram schematically illustrating an example of a liquid treating chamber of FIG. 3.

FIG. 7 is a diagram schematically illustrating an example of the liquid treating chamber of FIG. 3. Referring to FIG. 7, the liquid treating chamber 360 may include a housing 361, a cup 363, a substrate support unit 365, and a liquid supply unit 369. The housing 361 may be provided in the shape of a substantially rectangular parallelepiped. An entrance (not illustrated) through which the substrate W enters and exits may be formed on a sidewall of the housing 361. The entrance may be opened/closed by a door (not illustrated). The cup 363, the substrate support unit 365, and the liquid supply unit 369 may be provided inside the housing 361. A fan filter unit 367 forming a downdraft within the housing 3620 may be provided in an upper wall of the housing 361. The cup 363 may have a treatment space with an open top. The support unit 365 is disposed in the treatment space and may support the substrate W. The support unit 365 may be provided so that the substrate W is rotatable during the liquid treatment. The liquid supply unit 369 may supply a liquid to the substrate W supported by the support unit 365.

The buffer chambers 380 may be provided in plural. Some of the plurality of buffer chambers 380 may be disposed between the index module 100 and the transfer chamber 340. Hereinafter, the foregoing buffer chambers 380 are referred to as front buffers 3802. The front buffers 3802 may be provided in plural, and may be disposed to be stacked with each other in the vertical direction. Another some of the plurality of buffer chambers 380 may be disposed between the transfer chamber 340 and the interface module 400. Hereinafter, the buffer chambers 380 may be referred to as rear buffers 3804. The rear buffers 3804 may be provided in plural, and may be disposed to be stacked with each other in the vertical direction. The front buffers 3802 and the rear buffers 3804 may temporarily store the plurality of substrates W, respectively. The substrate stored in the front buffer 3802 may be loaded or unloaded by the index robot 132 and the transfer 342. The substrate W stored in the rear buffer 3804 may be loaded or unloaded by the transfer robot 342 and the first robot 442. Each of the buffer chambers 3802 and 3804 may temporarily store the substrate before and after the process processing of the substrate, and may be provided as a cooling unit (not illustrated) capable of cooling the substrate. The cooling unit may be provided so that a plurality of Wafer Cooling Plates (WCPs) is stacked in the vertical direction. The cooling units may be provided in plural to be positioned to correspond to the coating modules 300a and the developing modules 300b, respectively.

The developing block 300b may include a heat treating chamber 320, a transfer chamber 340, and a liquid treating chamber 360. The heat treating chamber 320 and the transfer chamber 340 of the developing block 300b are provided in the structure and the disposition substantially similar to those of the heat treating chamber 320 and the transfer chamber 340 of the coating block 300a, so that the description thereof will be omitted.

In the developing block 300b, the liquid treating chambers 360 may be provided as developing chambers for developing the substrate by supplying the same developing liquid.

Referring back to FIGS. 1 to 3, the interface module 400 may connect the treating module 300 to an external exposing device 500. The interface module 400 may include an interface frame 410, an additional process chamber 420, an interface buffer 430, and a transfer member 440.

A fan filter unit for forming a descending airflow therein may be provided at an upper end of the interface frame 410. The additional process chamber 420, the interface buffer 430, and the transfer member 440 may be disposed inside the interface frame 410. The additional treating chamber 420 may perform a predetermined additional process before the substrate W, which has been completely processed in the coating block 300a, is loaded into the exposing device 500. Optionally, the additional treating chamber 420 may perform a predetermined additional process before the substrate W, which has been completely processed in the exposing device 500, is loaded into the developing block 300b. According to one example, the additional process is an edge exposure process of exposing an edge region of the substrate W, a top surface cleaning process of cleaning the upper surface of the substrate W, or a lower surface cleaning process of cleaning the lower surface of the substrate W. A plurality of additional process chambers 420 is provided, and may be provided to be stacked on each other. All of the additional process chambers 420 may be provided to perform the same process. Optionally, some of the additional process chambers 420 may be provided to perform different processes.

The interface buffer 430 may provide a space in which the substrate W transferred between the coating block 300a, the additional process chamber 420, the exposing device 500, and the developing block 300b temporarily stays during the transfer. A plurality of interface buffers 360 may be provided, and the plurality of interface buffers 360 may be provided to be stacked on each other.

According to the example, the additional process chamber 420 may be disposed on one side based on an extended line in the longitudinal direction of the transfer chamber 340 and the interface buffer 440 may be disposed on the other side.

The transfer member 440 may transfer the substrate W between the coating block 300a, the additional process chamber 420, the exposing device 500, and the developing block 300b. The transfer member 380 may be provided as one or a plurality of robots. According to the example, the transfer member 440 may include a first robot 442 and a second robot 444. The first robot 442 may transfer the substrate W between the coating block 300a, the additional process chamber 420, and the interface buffer 430, and the second robot 444 may transfer the substrate between the interface buffer 430 and the exposing device 500. According to the example, the transfer member 440 may include a third robot, and the third robot may be provided to transfer the substrate W between the interface buffer 430 and the developing block 300b. Each of the first robot 442 and the second robot 444 include a hand on which the substrate W is placed, and the hand may be provided to be movable in a forward and backward directions, rotatable based on an axis parallel to the third direction 16, and movable in the third direction 16.

All of the hands of the index robot 132, the first robot 442, and the second robot 444 may be provided in the same shape as that of the hand 344 of the transfer robot 342. Optionally, the hand of the robot that directly exchanges the substrate W with the transfer plate 324 of the heat treating chamber 320 may be provided in the same shape as that of the hand 344 of the transfer robot 342, and the hand of the remaining robot may be provided in a different shape.

According to the exemplary embodiment, the index robot 132 is provided to directly exchange the substrate W with the heating unit 323 of the front heat treating chamber 323 provided to the coating block 300a.

Further, the transfer robots 342 provided to the coating block 300a and the developing block 300b may be provided to directly exchange the substrate W with the transfer plate 324 located in the heat treating chamber 320.

The substrate treating facility 10 may include a differential pressure measuring device 600. Hereinafter, the differential pressure measuring device 600 according to an exemplary embodiment of the present invention will be described in detail with reference to the drawings.

Figure 8:
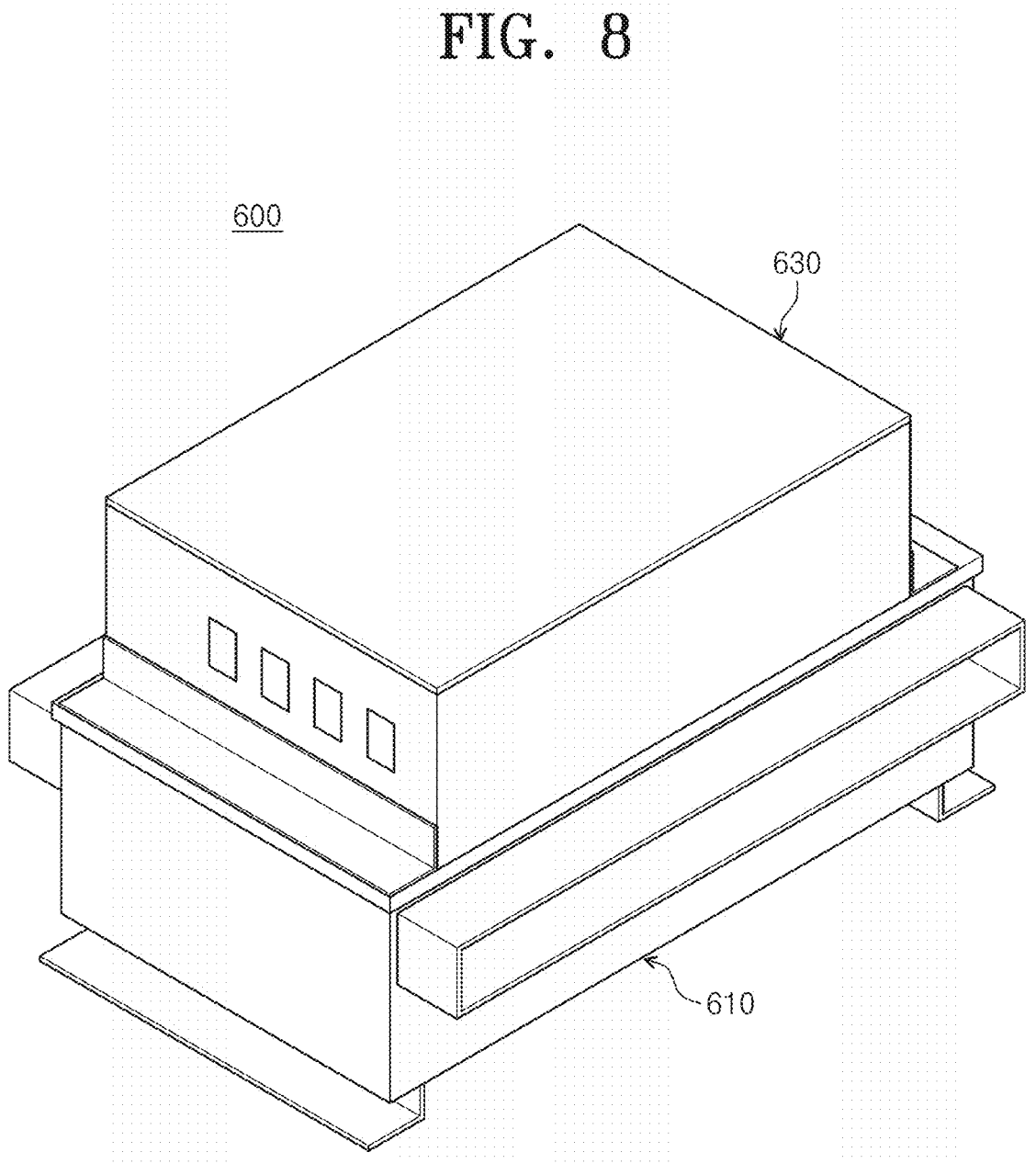
FIG. 8 is a perspective view of a differential pressure measuring device according to an exemplary embodiment of the present invention.
Figure 9:
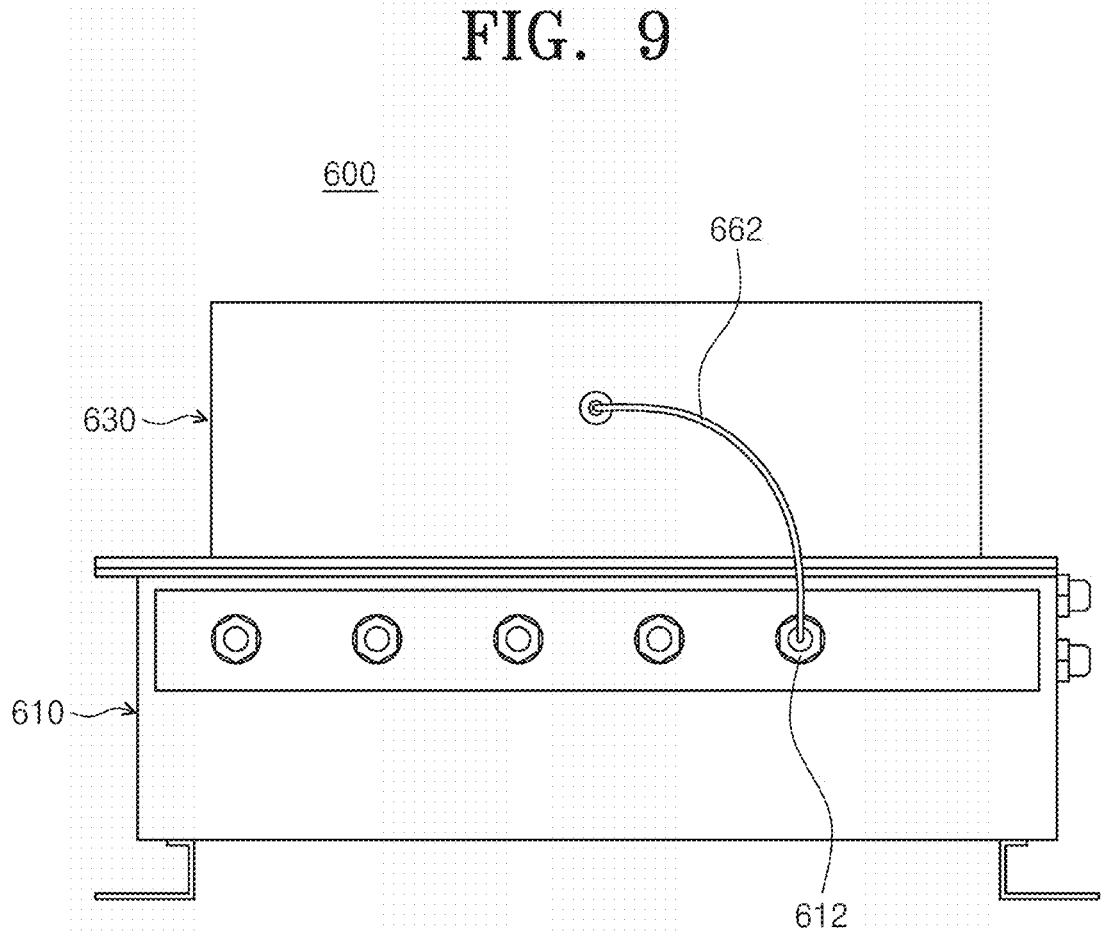
FIG. 9 is a front view of the differential pressure measuring device of FIG. 8.
Figure 11:
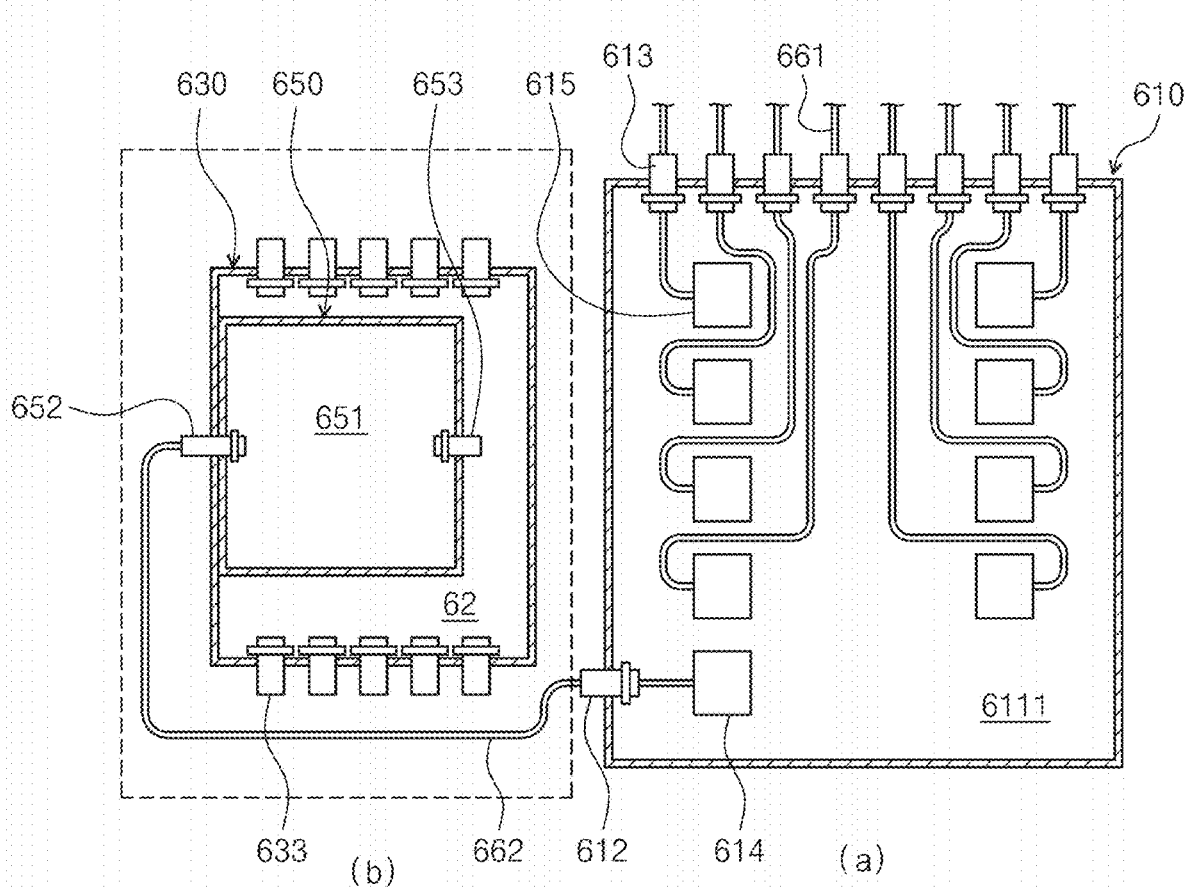
FIG. 11 is a cross-sectional view of the differential pressure measuring device of FIG. 8.
Figure 12:
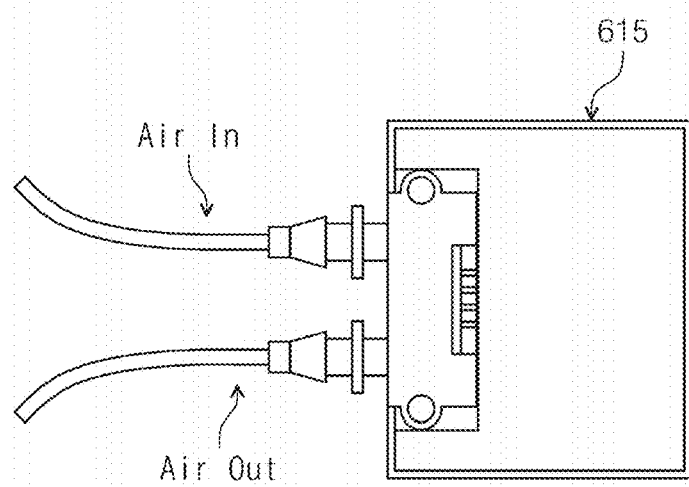
FIG. 12 is a diagram schematically illustrating an example of a differential pressure board of FIG. 11.

FIG. 8 is a perspective view of a differential pressure measuring device according to an exemplary embodiment of the present invention, FIG. 9 is a front view of the differential pressure measuring device of FIG. 8, FIG. 11 is a cross-sectional view of the differential pressure measuring device of FIG. 8, and FIG. 12 is a diagram schematically illustrating an example of a differential pressure board of FIG. 11.

The differential pressure measuring device 600 may measure a differential pressure between a pressure at a specific position inside the substrate treating facility 10 and a pressure at a reference position serving as a reference. For example, the differential pressure measuring device 600 may measure a differential pressure between a pressure at a specific position inside the index module 100, the treating module 300, or the interface module 400 provided to the substrate treating facility 10, and a pressure at a reference position. For example, the differential pressure measuring device 600 may measure the differential pressure between the pressure inside the index frame 130 and the pressure at the reference position. For example, the differential pressure measuring device 600 may measure a differential pressure between the pressure in each chamber (the heat treating chamber 320, the transfer chamber 340, and the liquid treating chamber 360) provided to the treating module 300 and the pressure at the reference position. The controller 700 may monitor the differential pressure measured by the differential pressure measuring device 600 and control the differential pressure value to be maintained constantly.

Referring to FIGS. 1 to 3, the differential pressure measuring device 600 may be provided outside the substrate treating facility 10. The differential pressure measuring device 600 may be provided at a position where the reference position for measuring the reference pressure is not affected by the surrounding environment or the influence by the surrounding environment is minimized The differential pressure measuring device 600 may be provided on a ceiling surface of a space in which the substrate treating facility 10 is provided, and may be provided at a position that does not overlap with a transfer rail (not illustrated) for transferring a transferred target. As an example, the differential pressure measuring device 600 may be provided at a location that does not overlap a driving path on which a transfer means, such as an overhead transfer (OHT), an overhead conveyor, or an automatic guided vehicle, travels.

The differential pressure measuring device 600 may be provided above the substrate treating facility 10. For example, the differential pressure measuring device 600 may be installed on the upper surface of the substrate treating facility 10. The differential pressure measuring device 600 may be provided above the buffer chamber 380 in the upper portion of the substrate treating facility 10. The differential pressure measuring device 600 may be provided on the upper surface of the front buffer chamber 3802. The differential pressure measuring device 600 may be provided in a central region of the upper surface of the front buffer chamber 3802. However, the present invention is not limited thereto, and the differential pressure measuring device 600 may be installed anywhere on the upper portion of the substrate treating stand 10 where the influence by the surrounding environment is minimal Through this, when the reference pressure, which is the reference for measuring the differential pressure, is measured, the influence from the surrounding environment may be minimized, so that the reference pressure may be maintained constantly. Through this, it is possible to more accurately measure and monitor the differential pressure, and it is possible to minimize the differential pressure hunting phenomenon.

Referring to FIGS. 8 to 12, the differential pressure measuring device 600 may include a first box unit 610, a second box unit 630, and a third box unit 650.

Figure 10:
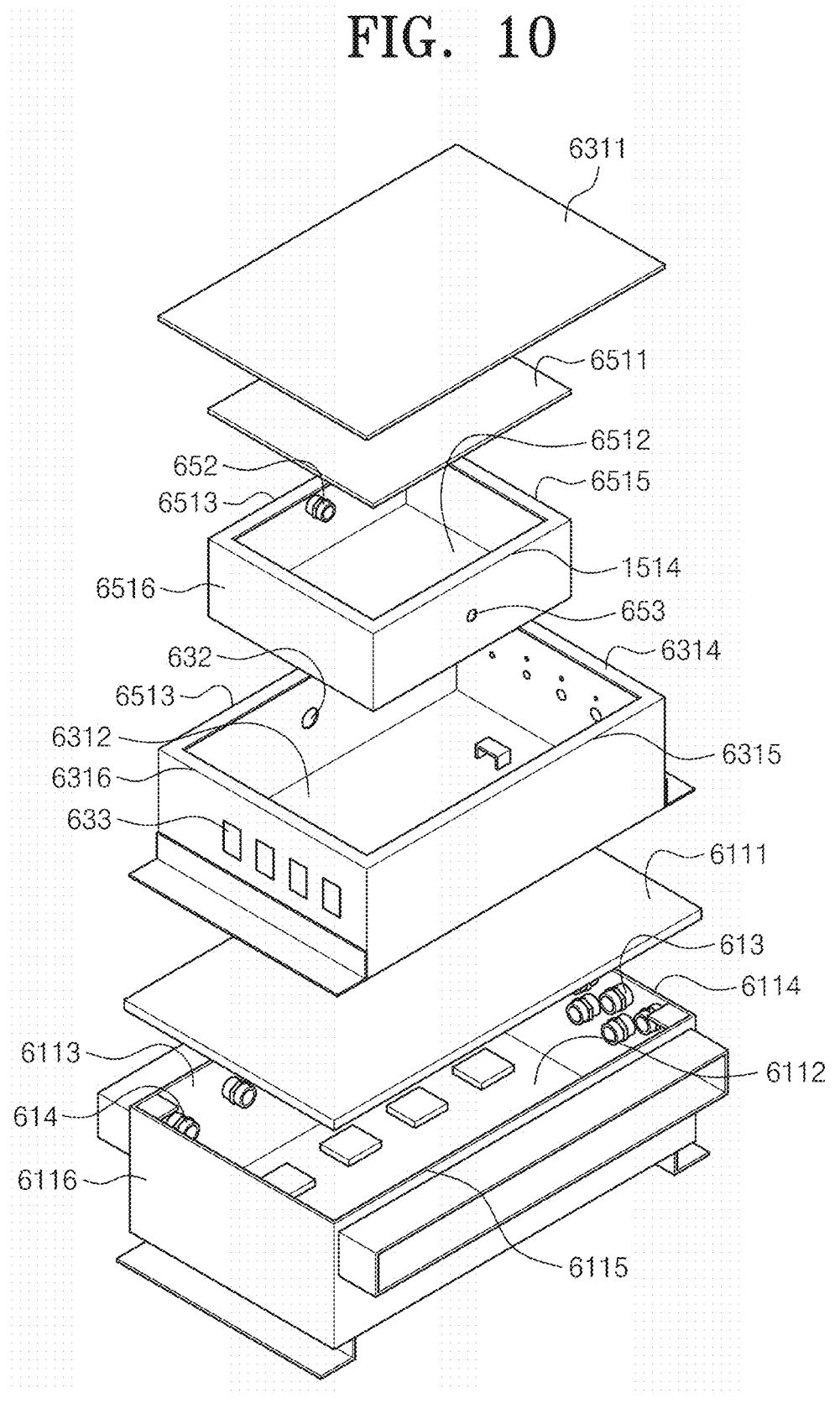
FIG. 10 is an exploded perspective view of the differential pressure measuring device of FIG. 8.

Referring to FIGS. 8 and 9, the first box unit 610 may be provided below the second and third box units 630 and 650. The first box unit 610 is provided in a rectangular cross-section, and may have an inner space 611 therein. Referring to FIG. 10, the first box unit 610 may include an upper plate 6111, a lower plate 6112 disposed opposite to the upper plate 6111, and a plurality of side plates 6113, 6114, 6115, and 6116 connecting the upper plate 6111 and the lower plate 6112. The plurality of side plates 6113, 6114, 6115, and 6116 may include first to fourth side plates 6113, 6114, 6115 and 6116 adjacent to each other. The inner space 611 of the first box unit 610 may be a space formed by a combination of the upper plate 6111, the lower plate 6112, and the first to fourth side plates 6113, 6114, 6115, and 6116.

The inner space 611 of the first box unit 610 may be provided as a space sealed by the upper plate 6111, the lower plate 6112, and the first to fourth side plates 6113, 6114, 6115, and 6116.

Referring to FIG. 11, the first box unit 610 may include a reference differential pressure port 612 and a differential pressure port 613. (a) of FIG. 11 is a cross-sectional view of the first box unit 610, and (b) of FIG. 11 is a cross-sectional view of the second and third box units 630 and 650.

The differential pressure port 613 may be provided on any one of the plurality of side plates of the first box unit 610.

The differential pressure port 613 may include a plurality of differential pressure ports 613. The plurality of differential pressure ports 613 may be provided on any one of the plurality of side plates. The plurality of differential pressure ports 613 may be spaced apart from each other. However, the present invention is not limited thereto and the plurality of differential pressure ports 613 may be provided at a position where connection with a connection line to be described later is easy. For example, the plurality of differential pressure ports 613 may be provided on different side plates. The differential pressure port 613 may be a port to which a first connection line 661 to be described later is coupled. The differential pressure port 613 may be provided as a hole penetrating the side plate. A first connection line 661 may pass through the differential pressure port 613. The plurality of differential pressure ports 613 may be provided in a number corresponding to the number of differential pressure boards 615 provided inside the first box unit 610.

The reference differential pressure port 612 may be provided on any one of the plurality of side plates. The reference differential pressure port 612 may be coupled to a second connection line 662 to be described later. The reference differential pressure port 612 may be a connection passage between the reference position connected through the second connection line 662 and the reference differential pressure board 614. The reference differential pressure port 612 may include one reference differential pressure port 612. The reference differential pressure port 612 may be provided on a side plate different from the side plate on which the differential pressure port 613 is provided. Alternatively, the reference differential pressure port 612 may be provided on the same side plate on which the differential pressure port 613 is provided. That is, the reference differential pressure port 612 may be provided at a position where the second connection line 662 is easy to connect the reference differential pressure board 612 and the reference position.

The first box unit 610 may include the reference differential pressure board 614 and a differential pressure board 615 provided in the inner space 611. The reference differential pressure board 614 and the differential pressure board 615 may be provided as sensors. The reference differential pressure board 614 and the differential pressure board 615 may be provided as pressure measuring sensors that measure pressure in a specific space. For example, the reference differential pressure board 614 and the differential pressure board 615 may be provided as room pressure measuring sensors.

The differential pressure board 615 may include a plurality of differential pressure boards 615. Each of the plurality of differential pressure boards 615 may be connected one-to-one with a plurality of differential pressure ports 613 to be described later. In addition, each of the plurality of differential pressure boards 615 may be connected one-to-one with a chamber of which the differential pressure is to be measured in the treating module 300. The differential pressure board 615 may be connected to the first connection line 661. One end of the first connection line 661 may be connected to the differential pressure board 615, and the other end may be provided in a space in which pressure is to be measured. In this case, the space in which the pressure is to be measured may be a treatment space of any one of a plurality of chambers provided in the treating module 300. For example, the other end of the first connection line 661 may be connected to any one of the treatment space of the heat treating chamber 320, the inner space of the transfer chamber 340, and the treating space of the liquid treating chamber 360. In addition, a sensor may be coupled to the other end of the first connection line 661, and through this, the differential pressure board 515 may measure the pressure of the space in which the other end of the first connection line 661 is located.

The differential pressure board 615 may include a plurality of differential pressure boards 615. The plurality of differential pressure boards 615 may be provided in the inner space 611 of the first box unit 610. The plurality of differential pressure boards 615 may be disposed to be spaced apart from each other inside the first box unit 610. When a plurality of differential pressure boards 615 are provided, a plurality of first connection lines 661 may also be provided to be connected to the plurality of differential pressure boards 615, respectively. For example, when the plurality of differential pressure boards 615 include a first differential pressure board, a second differential pressure board, and a third differential pressure board, the first connection line 661 may include a first-1 connection line connected to the first differential pressure board, a first-2 connection line connected to the second differential pressure board, and a first-3 connection line connected to the third differential pressure board. In this case, the first-1 connection line, the first-2 connection line, and the first-3 connection line may be connected to different chambers. For example, the first-1 connection line may be connected to any one of the plurality of liquid treating chambers 360 provided in the coating block 30a of the substrate treating facility 10, the first-2 connection line may be connected to another one of the plurality of liquid treating chambers 360 provided in the coating block 30a of the substrate treating facility 10, and the first-3 connection line may be connected to another one of the plurality of liquid treating chambers 360 provided in the coating block 30a of the substrate treating facility 10. In this case, the first differential pressure board may measure the pressure of the treating space of any one of the plurality of liquid treating chambers 360, the second differential pressure board may measure the pressure of the treating space of another one of the plurality of liquid treating chambers 360, and the third differential pressure board may measure the pressure of the treating space of another one of the plurality of liquid treating chambers 360. In addition, as an example, the first-1 connection line may be connected to any one of the plurality of liquid treating chambers 360 provided in the coating block 30a of the substrate treating facility 10, the first-2 connection line may be connected to another one of the plurality of heat treating chambers 320 provided in the coating block 30a of the substrate treating facility 10, and the first-3 connection line may be connected to the transfer chamber 340 provided in the coating block 30a of the substrate treating facility 10. In this case, the first differential pressure board may measure the pressure of the treating space of any one of the plurality of liquid treating chambers 360, the second differential pressure board may measure the pressure of the treating space of any one of the plurality of heat treating chambers 320, and the third differential pressure board may measure the pressure of the treating space of the transfer chamber 340. For example, the first-1 connection line may be connected to any one of the plurality of chambers provided in the coating block 30a of the substrate treating facility 10, and the first-2 connection line may be connected to any one of the plurality of chambers provided in the developing block 30b of the substrate treating facility 10. In this case, the first differential pressure board may measure the pressure of the treating space of any one of the plurality of chambers provided in the coating block 30a, and the second differential pressure board may measure the pressure of the treating space of any one of the plurality of chambers provided in the developing block 30b. That is, the differential pressure board 615 is provided in a number corresponding to the number of chambers in which the internal pressure is to be measured, and may be connected to each chamber one-to-one by the first connection line 661.

The reference differential pressure board 614 is provided in the inner space 611 of the first box unit 610. The reference differential pressure board 614 is disposed to be spaced apart from the differential pressure board 615. The reference differential pressure board 614 may measure the pressure at the reference position. The reference differential pressure board 614 may be connected to a space for measuring the reference pressure by the second connection line 662. The reference differential pressure board 614 provides a reference pressure for measuring the differential pressure. The reference pressure may be the pressure of the inner space of the third box unit 650 to be described later. The reference differential pressure board 614 may be connected to the inner space of the third box unit 650 by a second connection line 662. One end of the second connection line 662 may be connected to the reference differential pressure board 614, and the other end may be connected to the inner space of the third box unit 650.

FIG. 12 illustrates the differential pressure board. The differential pressure board illustrated in FIG. 12 may be the reference differential pressure board 614 and/or the differential pressure board 615. That is, the differential pressure board 615 and the reference differential pressure mode 614 may be provided in the same structure. Hereinafter, the differential pressure board 615 will be described as a reference. The differential pressure board 615 may include an air-in port 6131 for receiving an airflow in a space to measure pressure. The air-in port 6131 may be connected to the first connection line 661. An in-port of the reference differential pressure board 614 may be connected to the second connection line 662. The differential pressure board 615 may measure the pressure of the airflow introduced through the air-in port 6131. The differential pressure board 615 may include an air-out port 6132. However, the air-out port 6132 may be omitted, or the air-out port 6132 may be maintained in a closed state as illustrated in FIG. 11.

The second box unit 630 may be provided on the first box unit 610. The second box unit 630 may have a rectangular cross-section. The cross-sectional area of the second box unit 630 may be smaller than the cross-sectional area of the first box unit 650. The cross-sectional area of the second box unit 630 may be greater than the cross-sectional area of the third box unit 650. The second box unit 630 may have an inner space 631. The third box unit 650 may be accommodated in the inner space 631 of the second box unit 630. The second box unit 630 may include an upper plate 6311, a lower plate 6312 disposed opposite to the upper plate 6311, and a plurality of side plates connecting the upper plate 6311 and the lower plate 6312. The plurality of side plates may include first to fourth side plates 6313, 6314, 6315, and 6316 which are adjacent to each other. The inner space 631 of the second box unit 630 may be provided as a space sealed by the upper plate 6311, the lower plate 6312, and the plurality of side plates 6313, 6314, 6315, and 6316. The first side plate 6313 of the second box unit 630 may be in contact with the first side plate 6513 of the third box unit 650 to be described later. The third side plate 6315 of the second box unit 630 may be spaced apart from the second side plate 6514 of the third box unit 650 to be described later.

The second box unit 640 may include a hole 632. The hole 632 may be formed in the first side plate 6313. The hole 632 may be connected to a first port 652 of the third box unit 650 to be described later. The first port 652 of the third box unit 650 to be described later may be disposed in the hole 632. The hole 632 is formed at a position corresponding to the first port 652 of the third box unit 650 to be described later, and may communicate with the first port 652. Through this, the second connection line 662 may be connected to the hole 632. The second connection line 662 may be connected to the first port 652 through the hole 632.

A port 633 may be provided on the second side plate 6314 and the fourth side plate 6316 which are disposed opposite to each other among the plurality of side plates of the second box unit 640. The port 633 may include a plurality of ports 633. The plurality of ports 633 may be maintained in a closed state. However, when it is necessary to adjust the pressure of the inner space 631 of the second box unit 630, the plurality of ports 633 may be selectively switched to an open state. An opening/closing device may be provided in the plurality of ports 633.

The third box unit 650 may be provided in the second box unit 630. The third box unit 650 may have a rectangular cross-section. The third box unit 650 may have an inner space 651. The third box unit 650 may include an upper plate 6511, a lower plate 6512 disposed opposite to the upper plate 6511, and a plurality of side plates connecting the upper plate 6511 and the lower plate 6512. The inner space 651 may be a space defined by the upper plate 6511, the lower plate 6512, and the plurality of side plates. The plurality of side plates may include a first side plate 6513 that is in contact with the first side plate 6313 of the second box unit 630, a second side plate 6514 disposed on the opposite side of the first side plate 6513, and a third side plate 6515 and a fourth side plate 6516 connecting the first side plate 6513 and the second side plate 6514. The first side plate 6513 may be in contact with the first side plate 6313 of the second box unit 630. The second side plate 6514 may face the third side plate 6315 of the second box unit 630. The second side plate 6514 may be spaced apart from the third side plate 6315 of the second box unit 630. The third side plate 6515 may face the second side plate 6314 of the second box unit 630. The third side plate 6515 may be spaced apart from the second side plate 6314 of the second box unit 630. The fourth side plate 6516 may face the fourth side plate 6316 of the second box unit 630. The fourth side plate 6516 may be spaced apart from the fourth side plate 6316 of the second box unit 630.

The third box unit 650 may include a first port 652. The first port 652 may be provided on the first side plate 6513 of the third box unit 650. The first port 652 may communicate with the hole 632 of the second box unit 630. The first port 652 may be formed at a position corresponding to the hole 632 of the two-box unit 630. The first port 652 may be connected to the other end of the second connection line 662.

The third box unit 650 may include a second port 653. The second port 653 may be disposed opposite to the first port 652. The second port 653 may be formed on the second side plate 6514. The second port 653 may be provided as a through hole passing through the second side plate 6514. The inner space 651 of the third box unit 650 may communicate with the inner space 631 of the second box unit 630 by the second port 653. Through this, the pressure of the inner space 651 of the third box unit 650 may be provided as a pressure corresponding to the pressure of the inner space 631 of the second box unit 630.

The third box unit 650 may be provided as a space for measuring the reference pressure for measuring the differential pressure. The reference pressure measured by the reference differential pressure board 614 may be the pressure of the inner space 651 of the third box unit 650. The pressure of the inner space 651 of the third box unit 650 may be provided as atmospheric pressure. A pressure difference between the pressure of the inner space 631 of the second box unit 630 and the pressure of the inner space 650 of the third box unit 650 may be zero.

The third box unit 650, which is a space for measuring the reference pressure, is accommodated in the second box unit 630, thereby minimizing the influence of the surrounding environment. Through this, it is possible to prevent a pressure hunting phenomenon in which the reference pressure is constantly fluctuated. By preventing the hunting phenomenon of the reference pressure, which is the reference of the differential pressure, accurate differential pressure monitoring and control of the differential pressure may be possible.

The substrate treating facility 10 may include a controller 700. The controller 700 may control the substrate treating facility 10. For example, the controller 700 may control components of the substrate treating facility 10. For example, the controller 700 may control each configuration of the substrate treating facility 10 so that the differential pressure measured by the differential pressure measuring device 600 maintains a constant value. Also, the controller 700 may control each process in which the substrate W is treated in the substrate treating facility 10.

Further, the controller 700 may include a process controller formed of a microprocessor (computer) that executes the control of the substrate treating facility 10, a user interface formed of a keyboard in which an operator performs a command input operation or the like in order to manage the substrate treating facility 10, a display for visualizing and displaying an operation situation of the substrate treating facility 10, and the like, and a storage unit storing a control program for executing the process executed in the substrate treating facility 10 under the control of the process controller or a program, that is, a treatment recipe, for executing the process in each component according to various data and treatment conditions. Further, the user interface and the storage unit may be connected to the process controller. The processing recipe may be stored in a storage medium in the storage unit, and the storage medium may be a hard disk, and may also be a portable disk, such as a CD-ROM or a DVD, or a semiconductor memory, such as a flash memory.

The controller 700 may receive the respective pressures measured from the reference differential pressure board 614 and the differential pressure board 615. In this case, the pressure measured by the reference differential pressure board 614 may be referred to as a reference pressure. The controller 700 may calculate a differential pressure between the reference pressure measured by the reference differential pressure board 614 and the pressure measured by the differential pressure board 615. The controller 700 may monitor and control the differential pressure between the reference pressure measured by the reference differential pressure board 614 and the pressure measured by the differential pressure board 615. For example, when the process result is changed due to the loss of exhaust pressure in the liquid treating chamber 360 in which the coating process is performed (for example, change in the thickness (thickness, THK) of the coated film, change in the degree of Edge Bead Removal (EBR)), the internal pressure of the liquid treating chamber 360 is increased, so that the differential pressure value is also increased. In this case, the controller 700 increases the pressure in the area of the transfer chamber 340 connected to the liquid treating chamber 360 in which the coating process is performed to control the amount of airflow blown into the liquid treating chamber 360 in which the coating process to be changed. Through this, the differential pressure may be controlled by adjusting the pressure in the treating space of the liquid treating chamber 360 in which the coating process is performed.

For example, the controller 700 may monitor a first differential pressure between the pressure measured by the first differential pressure board connected to the treating space of the first treating chamber and the reference pressure measured by the reference differential pressure board 614. Also, the controller 700 may monitor a second differential pressure between the pressure measured by the second differential pressure board connected to the treating space of the second treating chamber and the reference pressure measured by the reference differential pressure board 614. In this case, the controller 700 may set and control the first differential pressure and the second differential pressure as different differential pressures. This may vary depending on the type of process performed in each treating chamber. Alternatively, even when the same process is performed in each treating chamber, each chamber may be controlled with a differential pressure according to a process recipe.

Hereinafter, a differential pressure measuring device according to another exemplary embodiment of the present invention will be described with reference to the drawings.

Figure 13:
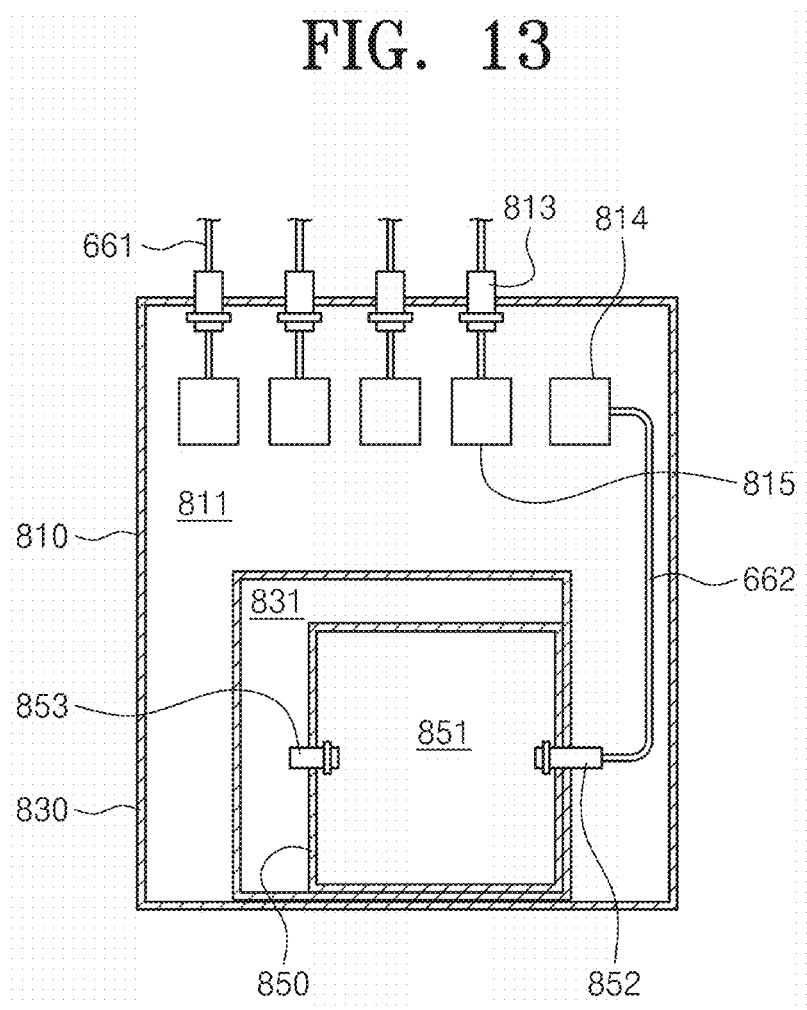
FIG. 13 is a cross-sectional view of a differential pressure measuring device according to another exemplary embodiment of the present invention.

FIG. 13 is a cross-sectional view of a differential pressure measuring device according to another exemplary embodiment of the present invention. In the differential pressure measuring device 600 according to the exemplary embodiment, the second box unit 630 and the third box unit 650 are disposed on the first box unit 610, but in a differential pressure measuring device 800 according to another exemplary embodiment, a second box unit 830 may be disposed in an inner space 811 of a first box unit 810, and the third box unit 850 may be disposed in the inner space 831 of the second box unit 830.

A plurality of differential pressure boards 815 and one reference differential pressure board 814 may be provided in the inner space 811 of the first box unit 810. A plurality of differential pressure ports 813 connected to a plurality of differential pressure boards 815 and a reference differential pressure port 812 connected to the reference differential pressure board 814 may be provided on one sidewall of the plurality of sidewalls of the first box unit 810. Each of the plurality of differential pressure boards 815 may be connected to a plurality of differential pressure ports 813 and a plurality of chambers by a plurality of first connection lines 661. Through this, each of the plurality of differential pressure boards 815 may measure the pressure of the connected treating space. Each of the reference differential pressure boards 814 may be connected to the reference differential pressure port 812 and the third box unit 850 by a second connection line 662. Through this, the reference differential pressure board 814 may measure the pressure of an inner space 851 of the third box unit 850. The controller 700 may monitor the differential pressure by measuring a differential pressure between the pressure measured by the differential pressure board 815 and the pressure measured by the reference differential pressure board 814. Also, the controller 700 may control the measured differential pressure to be maintained constantly.

The second box unit 830 may be in contact with one sidewall of the first box unit 810. As an example, the second box unit 830 may be spaced apart from the sidewall on which the differential pressure port 813 is provided among the plurality of sidewalls of the first box unit 810, and may be disposed to be in contact with a sidewall disposed opposite to the sidewall on which the differential pressure port 813 is provided among the plurality of sidewalls. The cross-section of the second box unit 830 may be smaller than the cross-section of the first box unit 810. Accordingly, among the plurality of sidewalls of the second box unit 830, the remaining sidewalls other than the sidewall that is in contact with the first box unit 810 may be spaced apart from the first box unit 810.

The third box unit 850 may be provided in the inner space 831 of the second box unit 830. The cross-section of the third box unit 850 may be smaller than the cross-section of the second box unit 830. The third box unit 850 may be disposed such that two adjacent sidewalls of the plurality of sidewalls are in contact with the second box unit 830. A first port 852 may be provided on one sidewall that is in contact with the second box unit 830 among the plurality of sidewalls of the third box unit 850. The first port 852 may be connected to the reference differential pressure board 814 and the second connection line 6620. The second port 853 may be provided on a sidewall disposed opposite to the sidewall on which the first port 852 is provided among the plurality of sidewalls. The second port 853 may be provided as a hole. Due to the second port 853, the inner space 851 of the third box unit 850 and the inner space 831 of the second box unit 830 may communicate with each other.

The differential pressure measuring device 600 according to the exemplary embodiment of the present invention and the differential pressure measuring device 800 according to another exemplary embodiment have only different structures, and may perform the measurement of the differential pressure, the monitoring of the differential pressure, and the control of the differential pressure in the same method. Accordingly, hereinafter, the duplicate description will be omitted.

In order to automatically manage the differential pressure in the substrate treating facility, the space or port that measures the reference pressure, which is the reference of the differential pressure, needs to be minimally affected by the surrounding environment. Otherwise, hunting of the reference pressure occurs due to surrounding environmental factors or artificial factors, making it impossible to accurately measure the differential pressure, which leads to poor differential pressure control and process defects. Therefore, it is important to keep the reference pressure serving as the reference constant.

According to the exemplary embodiment of the present invention, it is possible to provide a differential pressure control system capable of generally monitoring the differential pressure in the substrate treating facility and automatically correcting a deviation between modules or chambers. For automatic differential pressure compensation, constant management of the reference pressure serving as a reference is required, and according to the exemplary embodiment of the present invention, as the third box unit providing a space for measuring the reference pressure is provided inside the second box unit, environmental and artificial influences are minimized to prevent pressure hunting.

By preventing the hunting of the reference pressure, the reference pressure may be maintained constantly, so the differential pressure state of the entire facility may be reflected in real time, and the change factor may be easily analyzed by monitoring the state change of the facility.

The foregoing detailed description illustrates the present invention. Further, the above content illustrates and describes the exemplary embodiment of the present invention, and the present invention can be used in various other combinations, modifications, and environments. That is, the foregoing content may be modified or corrected within the scope of the concept of the invention disclosed in the present specification, the scope equivalent to that of the disclosure, and/or the scope of the skill or knowledge in the art. The foregoing exemplary embodiment describes the best state for implementing the technical spirit of the present invention, and various changes required in the specific application field and use of the present invention are possible. Accordingly, the detailed description of the invention above is not intended to limit the invention to the disclosed exemplary embodiment. Further, the accompanying claims should be construed to include other exemplary embodiments as well.

What is claimed is:

1. A substrate treating facility, comprising:
an index module configured to load or unload a substrate;
a treating module configured to perform a substrate treatment on the substrate loaded into the index module;
a buffer chamber between the index module and the treating module; and
a differential pressure measuring device configured to measure a differential pressure between a pressure at a specific position inside the substrate treating facility and a pressure at a reference position serving as a reference,
wherein the differential pressure measuring device is provided on an outside of the substrate treating facility, and
wherein the differential pressure measuring device includes:
a first box unit in pressure communication with the specific position;
a second box unit provided above the first box unit, the second box unit having a sealed inner space; and
a third box unit provided inside the second box unit, wherein the reference position is an inside of the third box unit,
wherein the first box unit includes a differential pressure board and a reference differential pressure board inside the first box unit, the differential pressure board is configured to measure the pressure at the specific position, and the reference differential pressure board is configured to measure the pressure at the reference position.

2. The substrate treating facility of claim 1, wherein the first box unit includes a differential pressure port provided on one side plate among a plurality of side plates and configured to connect to the specific position by a first connection line, and a reference differential pressure port provided on another side plate among the plurality of side plates and configured to connect to the reference position by a second connection line.

3. The substrate treating facility of claim 2, wherein the first box unit has a sealed inner space.

4. The substrate treating facility of claim 2,
the differential pressure board is connected to the first connection line, and the reference differential pressure board is connected to the second connection line.

5. The substrate treating facility of claim 4, comprising:
a controller,
wherein the controller is configured to control a difference between the pressure at the specific position measured by the differential pressure board and the pressure at the reference position measured by the reference differential pressure board such that the difference is to be maintained constantly.

6. The substrate treating facility of claim 2, wherein the third box unit includes a first side plate and a second side plate which are disposed opposite to each other among a plurality of side plates, a first port provided on the first side plate, and a second port provided on the second side plate,
the first side plate of the third box unit is provided to be in contact with one of the plurality of side plates of the second box unit, and the second side plate of the third box unit is provided to be spaced apart from the plurality of side plates of the second box unit, and
an inner space of the third box unit is configured to communicate with the inner space of the second box unit by the second port of the second side plate.

7. The substrate treating facility of claim 6, wherein the first port of the third box unit is formed through the first side plate and the one side plate of the second box unit, and
the first port is connected to the second connection line.

8. The substrate treating facility of claim 1, wherein the pressure at the reference position is provided as a pressure of the inner space of the third box unit, and
a difference between the pressure of the inner space of the second box unit and the pressure of the inner space of the third box unit is zero.

9. The substrate treating facility of claim 1, wherein the differential pressure measuring device is provided above the buffer chamber.

10. The substrate treating facility of claim 9, wherein the differential pressure measuring device is provided in a central region of an upper surface of the buffer chamber.

11. The substrate treating facility of claim 1, wherein the differential pressure measuring device is provided on a ceiling surface of a space in which the substrate treating facility is provided, and is provided at a position that does not overlap with a transfer rail configured to transfer a transferred target.

12. The substrate treating facility of claim 1, wherein the differential pressure measuring device is configured to isolate the reference position from a surrounding environment.

13. A differential pressure measuring device for measuring a differential pressure between a first pressure at a specific position and a second pressure at a reference position, the differential pressure measuring device comprising:
a first box unit having a sealed inner space in pressure communication with the specific position;
a second box unit disposed above the first box unit and having a sealed inner space; and
a third box unit provided inside the second box unit and having an inner space configured to communicate with the inner space of the second box unit,
wherein the second pressure is a pressure of the inner space of the third box unit,
wherein the first box unit includes a differential pressure board provided in the inner space of the first box unit and configured to measure the first pressure and a reference differential pressure board provided in the inner space of the first box unit and measuring the second pressure.

14. The differential pressure measuring device of claim 13, wherein a side plate of the first box unit includes a differential pressure port to which a first connection line connecting the specific position and the differential pressure board is connected, and a reference differential pressure port to which a second connection line connecting the reference position and the reference differential pressure board is connected.

15. The differential pressure measuring device of claim 14, wherein the third box unit includes a first side plate and a second side plate which are disposed opposite to each other among a plurality of side plates, a first port provided on the first side plate, and a second port provided on the second side plate, the first side plate of the third box unit is provided to be in contact with one of the plurality of side plates of the second box unit, and the second side plate of the third box unit is provided to be spaced apart from the plurality of side plates of the second box unit, and the inner space of the third box unit is configured to communicate with the inner space of the second box unit by the second port of the second side plate, and the second connection line is connected to the first port of the third box unit.

16. The differential pressure measuring device of claim 13, wherein a difference between the pressure of the inner space of the second box unit and the pressure of the inner space of the third box unit is zero.

17. A substrate treating facility, comprising:

an index module configured to load or unloading a substrate;

a treating module configured to perform a substrate treatment on the substrate loaded into the index module, and including a plurality of process chambers configured to perform different treatments on the substrate;

a buffer chamber disposed between the index module and the treating module;

a differential pressure measuring device disposed above the buffer chamber and is configured to measure a differential pressure between a pressure inside one of the plurality of process chambers and a pressure at a reference position; and a controller, wherein the differential pressure measuring device includes:

a first box unit having a sealed inner space and in pressure communication with the plurality of process chambers;

a second box unit disposed above the first box unit and having a sealed inner space; and a third box unit provided inside the second box unit and having an inner space configured to communicate with the inner space of the second box unit, and the pressure at the reference position is the pressure of the inner space of the third box unit, wherein the plurality of process chambers includes a first process chamber and a second process chamber, and wherein the first box unit includes a first differential pressure board which is provided in the inner space of the first box unit and is configured to measure a pressure inside the first process chamber, a second differential pressure board which is provided in the inner space of the first box unit and is configured to measure a pressure inside the second process chamber, and a reference differential pressure board which is provided in the inner space of the first box unit and is configured to measure a reference pressure.

18. The substrate treating facility of claim 17, wherein the first process chamber is configured to perform a liquid treatment on the substrate, and the second process chamber is configured to perform a heat treatment on the substrate, and, the controller is configured to control a difference between a pressure measured by the first differential pressure board and a reference pressure measured by the reference differential pressure board to be maintained as a first differential pressure, and control a difference between a pressure measured by the second differential pressure board and a pressure measured by the reference differential pressure board is maintained as a second differential pressure, and the first differential pressure and the second differential pressure are different.

* * * * *